United States Patent [19]

Lischke et al.

[11] Patent Number: 4,677,296

[45] Date of Patent: Jun. 30, 1987

[54] APPARATUS AND METHOD FOR MEASURING LENGTHS IN A SCANNING PARTICLE MICROSCOPE

[75] Inventors: Burkhard Lischke, Munich; Juergen Frosien, Ottobrunn, both of Fed. Rep. of Germany

[73] Assignee: Siemens Aktiengesellschaft, Berlin and Munich, Fed. Rep. of Germany

[21] Appl. No.: 766,504

[22] Filed: Aug. 19, 1985

[30] Foreign Application Priority Data

Sep. 24, 1984 [DE] Fed. Rep. of Germany ....... 3435037

[51] Int. Cl.⁴ .......................................... G01N 23/00
[52] U.S. Cl. .................................. 250/310; 250/307; 250/396 R; 250/398
[58] Field of Search ............... 250/307, 310, 397, 396, 250/398

[56] References Cited

U.S. PATENT DOCUMENTS

| | | | |
|---|---|---|---|
| 3,560,781 | 7/1967 | Riecke | 250/396 |
| 3,864,597 | 2/1975 | Trotel | 250/396 |
| 3,875,414 | 4/1975 | Prior | 250/398 |
| 4,219,719 | 8/1980 | Frosien et al. | 219/121 |
| 4,223,220 | 9/1980 | Feuerbaum | 250/310 |
| 4,370,554 | 1/1983 | Bohlen et al. | 250/397 |

OTHER PUBLICATIONS

"Automatic Pattern Positioning of Scanning Electron Beam Exposure", Miyauchi et al, IEEE Transactions on Electron Devices, vol. ED-17, No. 6, Jun. 1970.

Primary Examiner—Craig E. Church
Assistant Examiner—John C. Freeman
Attorney, Agent, or Firm—Hill, Van Santen, Steadman & Simpson

[57] ABSTRACT

A method and apparatus for measuring lengths in a scanning particle microscope employ a device for generating a particle beam directed toward a specimen stage on which a specimen is mounted. A second stage is placed over the specimen stage above the specimen, the second stage carrying a calibrated grid structure covering the region of the specimen to be measured. The grid structure is disposed a distance from the specimen which is less than or equal to the depth of focus of the apparatus. The grid structure is of known dimensions, and is utilized to provide bench marks for measuring distances on the specimen, and can be displaced as needed to measure longer distances.

16 Claims, 4 Drawing Figures

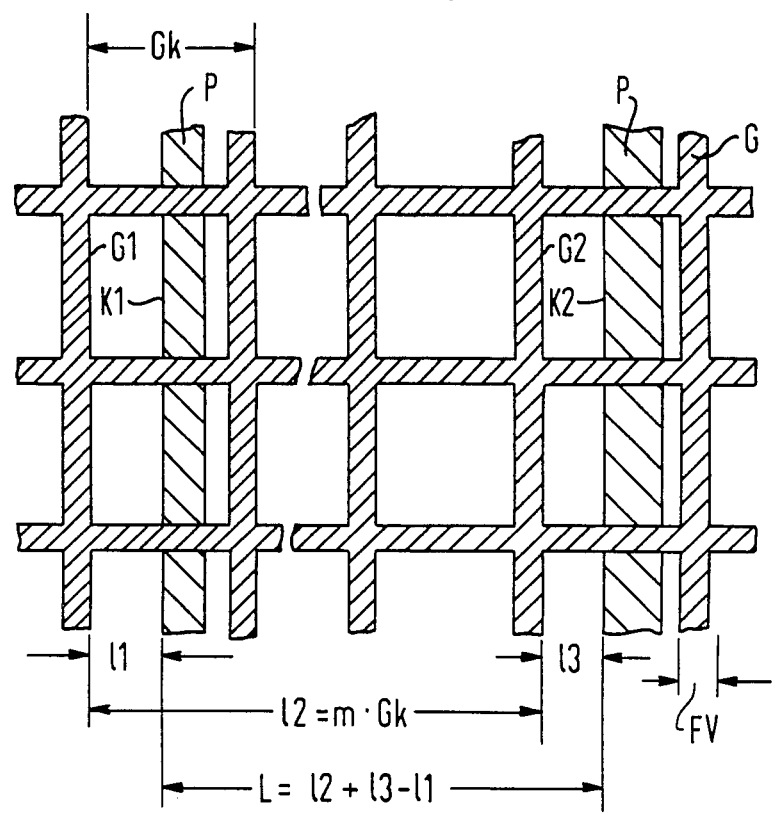

APPARATUS AND METHOD FOR MEASURING LENGTHS IN A SCANNING PARTICLE MICROSCOPE

BACKGROUND OF THE INVENTION

1. Field of the Invention

The present invention relates to methods and devices for measuring lengths in a scanning particle microscope, and in particular to a method and device for measuring lengths in such a microscope wherein the specimen is mounted on a specimen stage.

2. Description of the Prior Art

The increasing miniaturization and complexity of integrated circuits requires measurement and observation devices capable of accurately analyzing such small structures. Particularly in the case of integrated circuits, the electrical properties of the circuits are dictated by the geometrical configuration of the circuit integrated structure. In undertaking such measurements and observations, competing technical goals must be balanced. In particular, very high measuring precision is required, however, frequently relatively large measurements must be executed, such measurements being large in comparison to the individual structures being analyzed.

A problem exists in semiconductor technology of measuring relatively large lengths under such conditions. Examples of this measuring problem are the measuring of masks having diameters up to 5 inches (12.70 cm), determination of wafer warp during the manufacturing process, and determining distortion of lithographic structure generating devices. If one assumes that the measuring path amounts, for example, to approximately 10 mm, and that an absolute edge position precision of 0.1 μm is necessary, a relative measuring precision of $10^{-6}$ is required of the measuring method.

Because the field of view of both light microscopes and scanning electron microscopes falls far short of being adequate for the length measurement of such large paths, these microscopes are currently combined with laser beam-controlled microscope stages. In such a system, one edge or end of the path to be measured is brought into coincidence with a mark of the measuring microscope under microscopic observation. Thereafter, the microscope stage on which the specimen is now mounted is displaced until the second portion (the other end) of the path to be measured coincides with the marking of the measuring microscope. The displacement path necessary for this method, which was required in order to shift the entire path to be measured from one end to the other end at the marking of the measuring microscope, is measured with a laser interferometer. This displacement path measured with a laser interferometer, by which the microscope stage is thereby displaced, corresponds to the length of the path to be measured.

Such measuring installations wherein a microscope stage is coupled with a laser interferometer exists both in the combination of a laser stage/light microscope and in the combination of a laser stage-scanning electron microscope for length measurement with a sub-micrometer resolution. Such conventional measuring systems always require a relatively complex laser interferometer for monitoring the microscope stage, making the price of such systems considerably more expensive.

SUMMARY OF THE INVENTION

It is an object of the present invention to provide a method and apparatus for undertaking measurement of lengths in a scanning particle microscope wherein measurement of relatively large lengths is possible and can be simply executed without loss of measurement precision.

It is a further object of the present invention to provide such a method and apparatus which can undertake such length measurements without the necessity of additional complex auxiliary devices.

The above objects are inventively achieved in a method and apparatus employing a scanning particle microscope with a first stage on which the specimen to be measured is mounted, and having a second stage disposed above the specimen stage having a calibrated grid structure covering the region of the specimen to be measured. The grid structure is disposed a distance from the specimen which is less than or equal to the depth of field of the apparatus.

When individual structures are to be measured with high precision, measuring instruments having high spatial resolution are required. In comparison to a light microscope, a scanning electron microscope has resolution which is higher by a factor of 10. With an apparatus and method constructed in accordance with the principles of the present invention, a relative measuring precision of $10^{-6}$ is also possible even when the measuring path has an absolute length of, for example, 100 mm. Given a measuring path of 100 mm in length, an edge position can be defined with an absolute precision of 0.1 μm.

In the method and apparatus in accordance with the principles of the present invention, paths on electrically insulating objects can also be measured, insofar as the primary particle energy does not exceed defined thresholds. These thresholds depend on the material composition of the object to be measured, on the specimen arrangement, and on the detector arrangement. Given standard detector and specimen arrangements and given employment of a primary electron beam, a primary electron energy should not exceed the following thresholds given the following material composition of the object under investigation in order that the charge status of the object does not significantly change during measurement:

(1) When an AZ 1470 resist structure is to be measured on a silicon dioxide substrate, the primary electron energy should not exceed a value of 0.9 keV.

(2) When an AZ 1470 resist structure on a polysilicon substrate is to be measured, the primary electron energy should not exceed a value of 1.1 keV.

(3) When a PBS resist structure on a chrome lithography mask is to be measured, the primary electron energy should not exceed a value of 0.7 keV.

(4) When a length measurement on a chrome structure on a glass substrate is to be undertaken, the primary electron energy should not exceed 2.0 keV.

The method and apparatus of the present invention may be employed in semiconductor technology wherein lithography masks and semiconductor wafers must be measured. The prerequisite for undertaking such measurements is that a specimen-associated primary electron energy is not exceeded. For materials employed in semiconductor technology, this threshold energy generally lies in an energy range below 3 keV, so that efficient low-voltage scanning electron microscopes are required for such measurements in semiconductor technology. Scanning electron microscopes having a field emission cathode are particularly well-suited for such a use. An improvement in the signal-to-noise ratio in the measured signal is sometimes needed to increase the measuring precision, and as a preparation for an automated length measurement. This is particularly true when measuring objects requiring a primary electron energy below 1 keV. For this purpose, digital processing of the measured signals, that is, the signal of the emitted secondary electrons, is particularly suitable becaue the signal-to-noise ratio can thus be improved without increasing the radiation dose.

An allocation of the respective edge position in the intensity profile of the measured signal is not possible in a simple manner when measuring microstructures given a photo-optical measuring method. In photo-optical measuring methods, the result of a length measurement depends on the arbitrary definition of an intensity threshold in the measured signal. Photo-optical measuring instruments for structure widths therefore can no longer be utilized without further modification for undertaking an absolute measurement of fine structures. If, by contrast, a structure width measurement is undertaken by means of a line scan in a scanning electron microscope, a significant improvement in the measuring precision is achieved. When measuring fine structures, the line scan signal has significantly steeper edges which coincide with the respective edge position than can be achieved in the measured signal of a photo-optical method. A precise length measurement is thereby possible with a scanning electron microscope because the measured variable (length) in such devices depends only slightly on the threshold position in the measured signal.

DESCRIPTION OF THE DRAWINGS

FIG. 4 illustrates a method for measuring longer lengths on the apparatus shown in FIG. 1 in accordance with the method disclosed herein.

DESCRIPTION OF THE PREFERRED EMBODIMENTS

Figure 1:
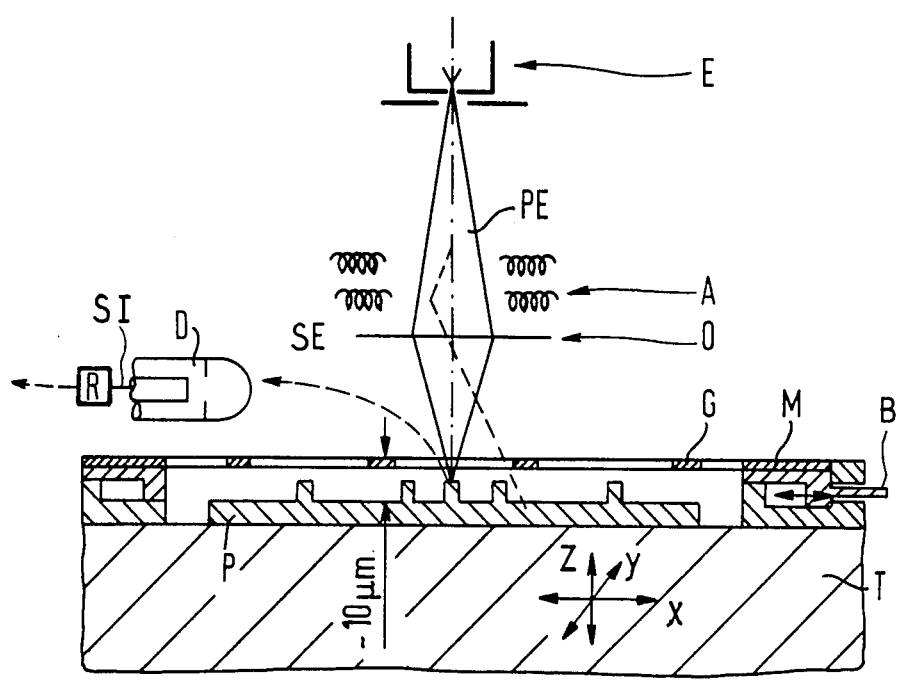
FIG. 1 is a side schematic view of a scanning particle microscope constructed in accordance with the principles of the present invention for practicing the method disclosed herein.

A measuring apparatus including a standard scanning electron microscope is shown in FIG. 1, having a specimen stage T with a second stage (measuring stage) M placed over the first stage T in accordance with the principles of the present invention. The stage M carries a large-area calibrated grid mask G which covers the entire upper surface of a substrate P to be measured. The grid G is disposed at a distance of a few micrometers, for example 10 $\mu$m, above the substrate P. The grid mask G must be previously measured, such as by using a laser interferometer, and represents a calibration scale which due to the high depth of field z is sharply imaged together with the substrate P. In scanning electron microscope imaging, the depth of field z is approximately 10 $\mu$m, given a loss of resolution of 0.1 m.

Length measurement can be executed in a simple manner by the introduction of the calibrated measuring grid G into a conventional scanning electron microscope. The calibrated measuring grid G may, for example, have a grid constant of 10 $\mu$m and, for example, a slat width of the grid slats of 1 $\mu$m. Lengths to be measured which are smaller than the grid opening of the measuring grid G can be identified directly from scanning electron microscope imaging, since the grid opening of the grid mask G supplied the calibration scale for such a measurement and the linearity of the scanning electron microscope imaging in the region of the grid opening of the measuring grid G is of a length and width of approximately 9 $\mu$m, which is sufficient.

The scanning electron microscope has an electron source E for generating a beam of primary electrons PE. The primary electrons PE can be deflected in two dimensions (x and y) by means of a deflection system A. Thus a sub-region of the substrate P can be scanned, for example across one or more grid openings of the measuring grid G. By means of the deflection system A, lengths which are smaller than a grid opening, or smaller than a few grid openings of the measuring grid G, can be directly identified from the scanning electron microscope imaging, whereby, as stated above, the grid mask G supplied the calibration scale required for this purpose. The primary electrons PE are focused at a point on the substrate P by means of an objective system O which may consist of one or more lenses. Upon incidence of the primary electrons PE on the substrate P, secondary electrons SE are triggered, which are documented in a secondary electron detector D and a measured signal SI is thereby obtained. The signal SI may be subjected to further processing in a device R, as described in greater detail below.

A scanning electron microscope of the type which can be modified in accordance with the principles of the present invention is described, for example, in U.S. Pat. No. 4,223,220.

The specimen stage T is displaceable in two dimensions, the small x-direction and the y-direction. The measuring stage M is additionally displaceable relative to the specimen stage T by means of a displacement device B. Thus the entire surface of the substrate P is accessible for measurement with the beam of primary electrons PE, and additionally regions of interest on the surface of the substrate P which, given a specific relative position of the grid mask G with respect to the substrate P, may be covered by a grid slat of the grid mask G can be exposed during a subsequent measurement.

Figure 2:
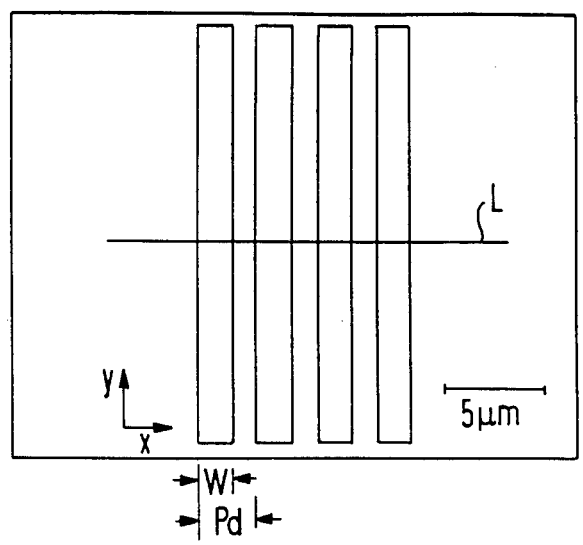
FIGS. 2 and 3 illustrate the measurement of short lengths on the apparatus shown in FIG. 1 in accordance with the method disclosed herein.
Figure 3:
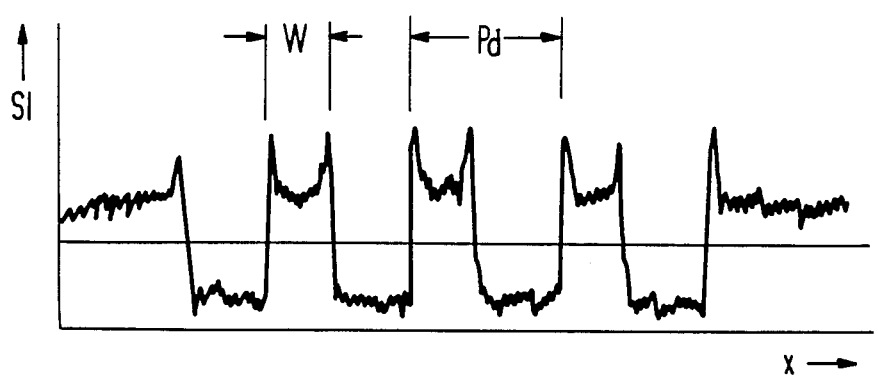

FIGS. 2 and 3 illsutrate the measurement of short lengths in accordance with the principles of the present invention. FIG. 2 shows a plan view of a scanning electron microscope image of, for example, one grid opening which has been recorded with a scanning electron microscope as shown in FIG. 1. The two-dimensional image of FIG. 2 shows an excerpt from a chrome mask having sharp-edge structure details. The sharp-edged structure details have a periodicity Pd of 3 $\mu$m, and a structure width W. When the structure of FIG. 2 is scanned along a line L in the direction of the x-axis with the scanning electron beam, a secondary electron measured signal SI is obtained, as shown in FIG. 3 as a function of x. The signal SI has such steep edges that it can be edited or processed without difficulty in a suitable manner for evaluation by a computer. For this purpose, for example, an evaluator can be connected in the signal processing chain following the secondary electron detector D, the evaluator having one or more threshold devices for evaluating the signal SI. One or more Schmitt trigger circuits may be utilized in the evaluator.

An edge position within a grid opening need not necessarily be identified by means of a line scan. For example, the image of a grid opening which has been recorded with a scanning electron microscope such as, for example, the image of FIG. 2, can be further processed by means of a digital image memory R (shown in FIG. 1) and an associated image processing system for enhancing the measuring precision, and as a preliminary step for undertaking an automated length measurement. As a result of such processing, the signal-to-noise ratio can be improved without increasing the radiation dose of the substrate P. For example, a low pass filter which is effective in the structure direction can be utilized for filtering the signal obtained from the secondary electrons, i.e., for processing the secondary electron image shown in FIG. 2. The effect of such filtering corresponds to a photo-optical column scan, whereby the length of such a column employed in a photo-optical column scan is simulated by the range of the low pass filter. An image thereby results which can be easily and precisely evaluated in terms of its intensity progression, and which can also be supplied to a computer for undertaking an automated line width measurement. The structure edges of the structure shown in FIG. 2 are isolated by gradient formation and discrimination. On the basis of this binary image, the computer is then able to identify a length within a selected measuring frame. In this manner, for example, a mean value for the distance of an ede from a grid slat of the grid mask G can be identified.

FIG. 4 illustrates a method in accordance with the principles of the present invention for undertaking longer length measurements. The specimen stage T must be displaced for measuring lengths which extend across many grid openings. High precision is thereby not required for adjustment of the specimen stage T. The measurement is then undertaken in three sections. First, the distance of a measuring edge K1 from an adjacent grid slat G1 is identified. The specimen stage T is then displaced until another measuring edge K2 comes into the field of view of the scanning electron microscope, and the number m of grid openings or periods which has been shifted through the field of the view of the scanning electron microscope is identified during displacement of the specimen stage T. Finally, the distance of a second measuring edge K2 from an adjacent grid slat G2 is identified. The distance L between the two measuring edges K1 and K2 is then calculated by the fomula L=12+13−11, whereby 12=m. Gk, wherein Gk is the distance of a period of the grid structure G. It will be understood that depending upon the positions of the edges K and K2 relative to the grid slats G1 and G2, other formulas involving addition and substraction may be utilized without departing from the inventive concept disclosed herein. When distances within the grid openings between the measuring edges K1 and K2 with respect to grid edges other than G1 and G2 are measured, these different distances are combined with the corresponding number of grid constants Gk to form the total distance L. The lengths can be identified as described in connection with FIGS. 2 and 3.

When the measuring stage M has a calibrated fine displacement FV relative to the specimen stage T, obtainable by the displacement device B, structures on the substrate P which would otherwise lie beneath a grid slat of the grid mask G can also be measured. The fine displacement FV must be slightly larger than the width of a grid stay and, for example, can be achieved by means of a piezo drive. The fine displacement FV must be taken into consideration in a corresponding manner in identifying the total distance L between the two measuring edges K1 and K2. The length measurement by means of the grid mask G described above can be easily automated, because positioning methods can be transferred from electron lithography technology for this purpose. For a distance determination of a measuring edge from an adjacent grid edge, for example, a digital line scan with a known step width as described in IEEE Transactions on Electron Devices, Miyauchi et al, Vol. ED-17, No. 6, June 1970 can be utilized, or the method disclosed in U.S. Pat. No. 4,219,719 can be employed. In the latter method, a grid opening which contains the measuring edge is scanned along a line with the same speed in both directions. In a digital scan, a first step count is thereby obtained during the forward run from the beginning of the line until the measuring edge is reached, and a second step count is obtained during the return from the end of the line to the measuring edge. After one pass, the distance of the measuring edge from a grid edge is obtained from the difference between the first and second step counts.

Counting of the grid periods of the measuring grid G during the rough displacement of the specimen stage T can be undertaken from the secondary electron signal SI given shut-off scanning of the beam of the primary electrons PE, since the rough displacement corresponds to a mechanical line scan in whose signal curve the grid slats are clearly emphasized.

For intensifying the secondary electron signal SI, and thus for enhancing the measuring precision, the measuring grid G may be charged with an electrical potential. Given employment of electron beams, positive grid voltages are preferable because such positive grid voltages extract the secondary electrons SE starting from the substrate P and accelerate them toward the detector D.

A grid G at a defined electrical potential above the substrate P is also preferable for a different reason. Given electically insulating substrates P, charges in electrical fields resulting therefrom, which arise during the electron irradiation, cannot have an effect as far into space above the substrate P, and therefore cannot have a significant influence on the beam of primary electrons PE. Charge-conditioned distortions of the image are therefore largely avoided, again benefiting the measuring precision.

The above identified dimensions for the grid mask G are by way of example only. The dimensions of the measuring grid G are matched to the particular measuring problem and to the structures to be measured. Grid masks employed for the electron projection are suitable for use as a measuring grid G. Other masks may be utilized, however, such as masks having defined holes. Moreover, the concept of the invention disclosed herein is not limited to the use of electron beams, any method and apparatus wherein an object to be measured is irradiated can be used in combination with the claimed subject matter as long as a sufficient depth of focus is present.

Although modifications and changes may be suggested by those skilled in the art it is the intention of the inventors to embody within the patent warranted hereon all changes and modifications as reasonably and properly come within the scope of their contribution to the art.

We claim as our invention:

1. An apparatus for undertaking measurements of microstructures on a specimen comprising:
    means for directing a particle beam at a portion of said specimen to be measured so as to generate emission of secondary particles from said specimen;
    means for selectively deflecting said particle beam with respect to said specimen;
    means for focussing said particle beam on said specimen;
    a first stage on which said specimen is mounted, said first stage being moveable for positioning said specimen within said particle beam;
    a second stage disposed above said specimen on said first stage, said second stage having a calibrated grid structure thereon covering a region of said specimen to be measured and also emitting secondary particles if a portion of said grid structure is in said particle beam;
    said grid structure being disposed a distance from said specimen which is less than or equal to the depth of field of said particle beam; and
    means for detecting said secondary particles emitted by said specimen and said grid structure.

2. An apparatus as claimed in claim 1 wherein said grid structure has a grid constant of approximately 10 $\mu$m.

3. An apparatus as claimed in claim 1 further comprising means for displacing said grid structure in calibrated fine steps.

4. An apparatus as claimed in claim 1 wherein said means for directing a particle beam at said specimen is selected for generating a particle beam having an energy such that said specimen is not electrically charged by said particle beam.

5. An apparatus as claimed in claim wherein said means for detecting includes means for digitally processing a measured signal obtained from said secondary electrons from said specimen.

6. An apparatus as claimed in claim 1 wherein said grid mask has a rectangular grid structure.

7. An apparatus as claimed in claim 1 wherein said grid mask has a plurality of defined holes therein.

8. A method for measuring microscopic lengths on a specimen disposed on a specimen stage comprising the steps of:
    scanning said specimen with a focussed particle beam for generating secondary electrons from said specimen;
    disposing a grid structure a distance above said specimen which is less than or equal to the depth of field of said particle beam said particle beam passing through said grid structure and said grid structure generating emission of secondary particles if in said particle beam; and
    simultaneously generating an image of said grid structure in combination with a region of said specimen to be measured by detecting the secondary electrons obtained from said specimen and from said grid.

9. A method as claimed in claim 8 wherein said grid structure has a grid spacing for measuring lengths less than said grid spacing.

10. A method as claimed in claim 9 comprising the additional step of:
    displacing said specimen stage by a selected amount for measuring lengths extending over more than one spacing of said grid.

11. A method as claimed in claim 10 wherein said specimen has at least first and second measuring edges thereon, and comprising the additional steps of:
    measuring the distance from said first measuring edge to an adjacent first grid edge;
    measuring the spacing after displacement of a second measuring edge from a second adjacent grid edge;
    multiplying the number of grid spacings during said grid displacement by a grid constant to identify the distance between said first and second grid edges; and
    calculating the distance between the first and second measuring edges by combining the results of the three previous steps.

12. A method as claimed in claim 11 comprising the additioal step of:
    finely displacing said grid structure by a selected amount for measuring an edge disposed beneath a slat of said grid; and
    adding said fine displacement into the calculation for said distance between said first and second measuring edges.

13. A method as claimed in claim 11 wherein the steps of measuring the distance between said first and second measuring edges and said respective first and second grid edges is further defined by undertaking a digital line scan between said measuring edges and said grid edges with a known step width.

14. A method as claimed in 11 comprising the additional step of:
    shutting off said particle beam for identifying the distance between said first and second grid edges.

15. A method as claimed in claim 8 comprising the additional step of charging said grid structure with an electrical potential.

16. A method as claimed in claim 8 comprising the additional step of digitizing the measured signals obtained from said secondary electron emission.

* * * * *